(12) United States Patent
Kajiyama et al.

(10) Patent No.: US 9,207,546 B2
(45) Date of Patent: Dec. 8, 2015

(54) EXPOSURE METHOD AND EXPOSURE APPARATUS

(75) Inventors: Koichi Kajiyama, Yokohama (JP); Toshinari Arai, Yokohama (JP)

(73) Assignee: V TECHNOLOGY CO., LTD., Kanagawa (JP)

( * ) Notice: Subject to any disclaimer, the term of this patent is extended or adjusted under 35 U.S.C. 154(b) by 752 days.

(21) Appl. No.: 13/495,668

(22) Filed: Jun. 13, 2012

(65) Prior Publication Data

US 2012/0249993 A1    Oct. 4, 2012

Related U.S. Application Data

(63) Continuation of application No. PCT/JP2010/071281, filed on Nov. 29, 2010.

(30) Foreign Application Priority Data

Dec. 14, 2009    (JP) ................... 2009-283067

(51) Int. Cl.
*G03B 27/44* (2006.01)
*G03B 27/42* (2006.01)
(Continued)

(52) U.S. Cl.
CPC .......... *G03F 7/70725* (2013.01); *G03F 7/7035* (2013.01); *G03F 7/70358* (2013.01); *G03F 7/70433* (2013.01); *G03F 7/70533* (2013.01)

(58) Field of Classification Search
CPC ............ G03F 7/70275; G03F 7/70283; G03F 7/70291; G03F 7/7035; G03F 7/70358; G03F 7/70391; G03F 7/704; G03F 7/70433; G03F 7/70533; G03F 7/70725; G03F 7/2022; G03F 7/203
USPC ........... 355/46, 52, 53, 55, 72–77; 250/492.1, 250/492.2, 492.22, 548; 430/5, 8, 22, 30, 430/311, 312, 321, 394
See application file for complete search history.

(56) References Cited

U.S. PATENT DOCUMENTS

| 4,814,830 | A | * | 3/1989 | Isohata et al. .................. 355/54 |
| 5,281,996 | A | * | 1/1994 | Bruning et al. .................. 355/77 |

(Continued)

FOREIGN PATENT DOCUMENTS

| JP | 06-053105 | 2/1994 |
| JP | 07-135165 | 5/1995 |

(Continued)

OTHER PUBLICATIONS

International Preliminary Report on Patentability (Chapter 1 of the Patent Cooperation Treaty) corresponding to International Application No. PCT/JP2010/071281 mailed Jul. 19, 2012.

*Primary Examiner* — Christina Riddle
(74) *Attorney, Agent, or Firm* — Finnegan, Henderson, Farabow, Garrett & Dunner LLP

(57) ABSTRACT

An exposure method includes a step of moving a photomask by a predetermined distance and switching a first mask pattern group to a second mask pattern group when an exposure to a first exposure area on an object to be exposed by the first mask pattern group of the photomask formed by arranging the first and the second mask pattern groups corresponding to an exposure patterns at predetermined intervals in a conveying direction of the object to be exposed is completed, and a step of performing an exposure on the second exposure area on the object to be exposed by the second mask pattern group, in which a moving speed of the photomask is controlled so that a moving distance of the object to be exposed is longer than a moving distance of the photomask in a period of time when switching the first and the second mask pattern groups.

10 Claims, 16 Drawing Sheets

(51) Int. Cl.
*G03B 27/32* (2006.01)
*G03F 7/20* (2006.01)
*G03B 27/52* (2006.01)

(56) References Cited

U.S. PATENT DOCUMENTS

| | | |
|---|---|---|
| 5,343,271 A | 8/1994 | Morishige |
| 5,437,946 A * | 8/1995 | McCoy ............................. 430/5 |
| 5,721,606 A * | 2/1998 | Jain ................................ 355/53 |
| 5,859,690 A * | 1/1999 | Toguchi ......................... 355/53 |
| 6,160,611 A | 12/2000 | Miyake |
| 6,331,885 B1 * | 12/2001 | Nishi .............................. 355/53 |
| 6,512,572 B1 * | 1/2003 | Morioka ......................... 355/53 |
| 6,552,775 B1 | 4/2003 | Yanagihara et al. |
| 2007/0013885 A1 * | 1/2007 | Loopstra et al. ................ 355/53 |

FOREIGN PATENT DOCUMENTS

| | | |
|---|---|---|
| JP | 11-237744 | 8/1999 |
| JP | 2001-215718 | 8/2001 |
| JP | 2007-281317 | 10/2007 |
| JP | 2008-310217 | 12/2008 |
| JP | 2009-058686 | 3/2009 |

\* cited by examiner

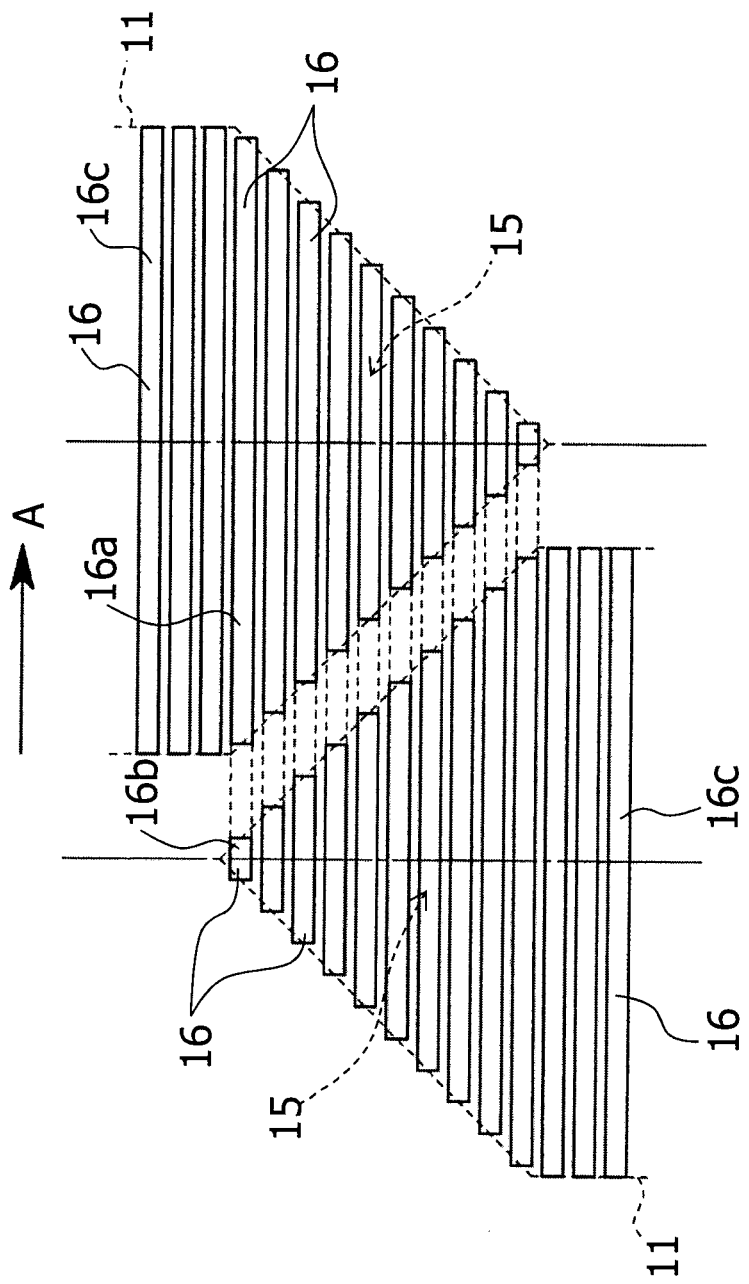

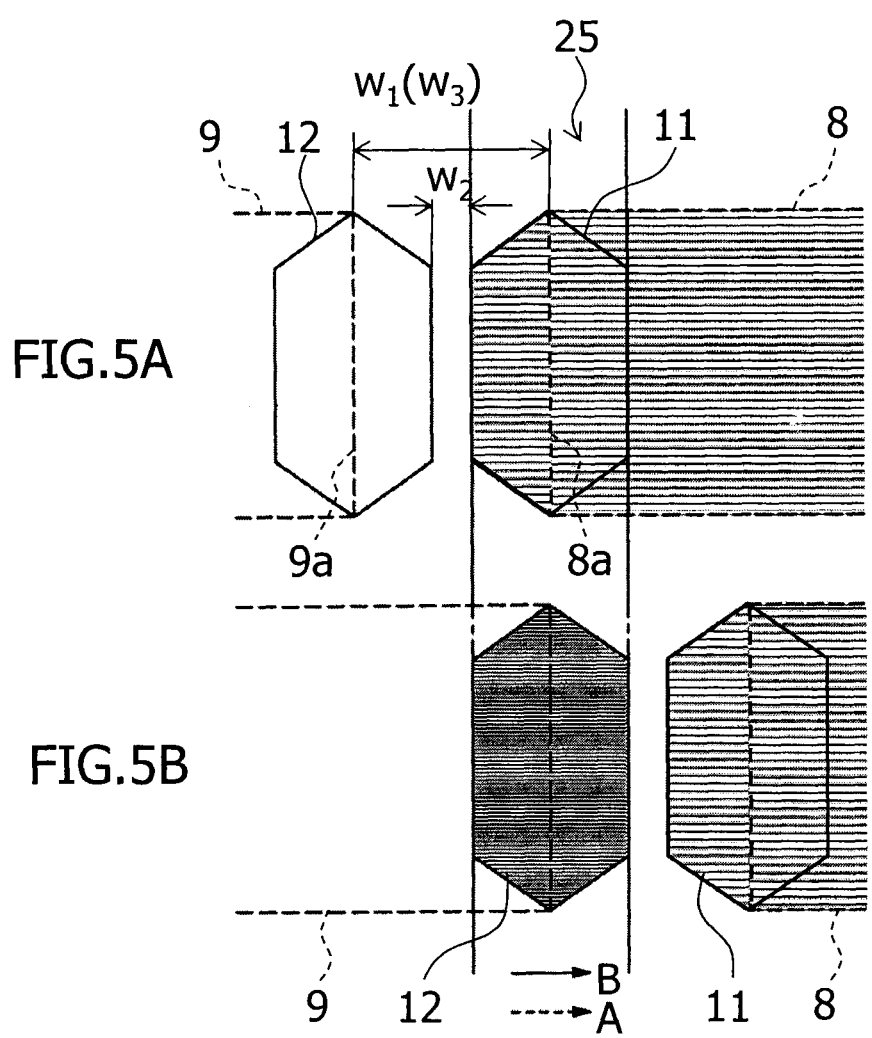

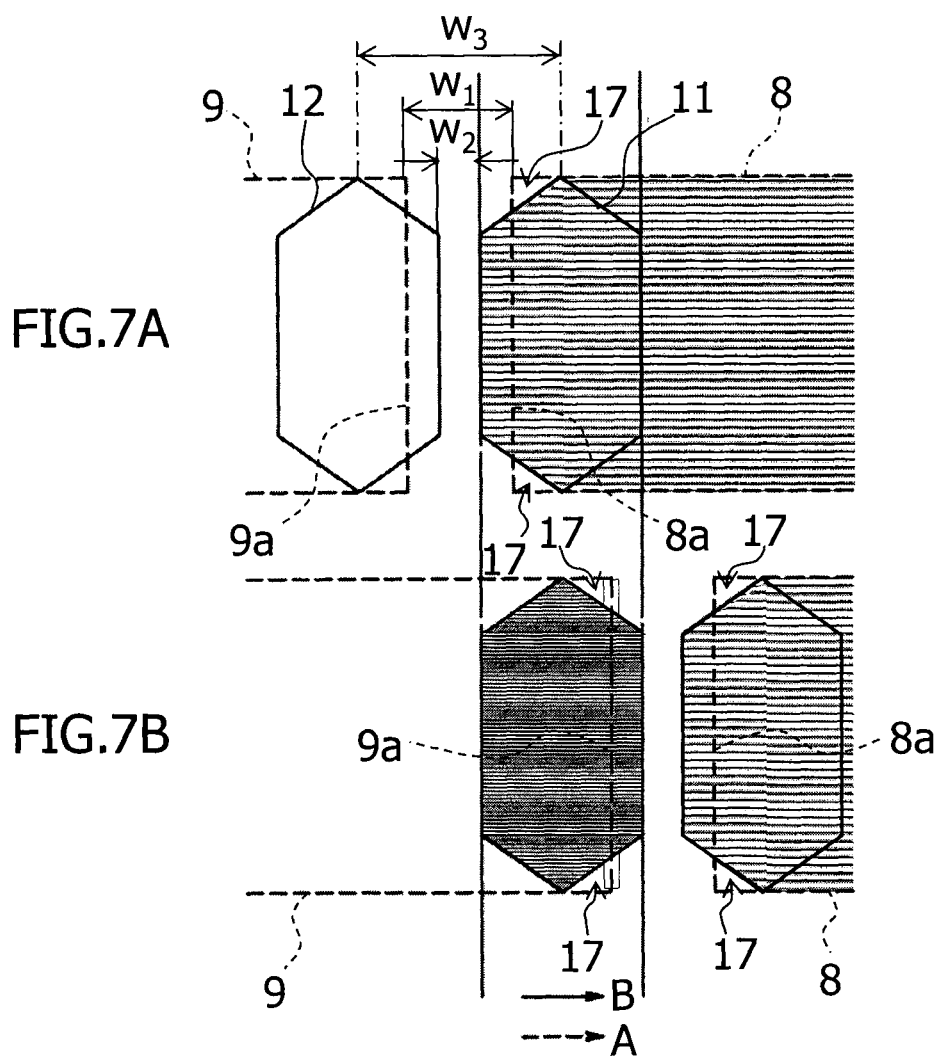

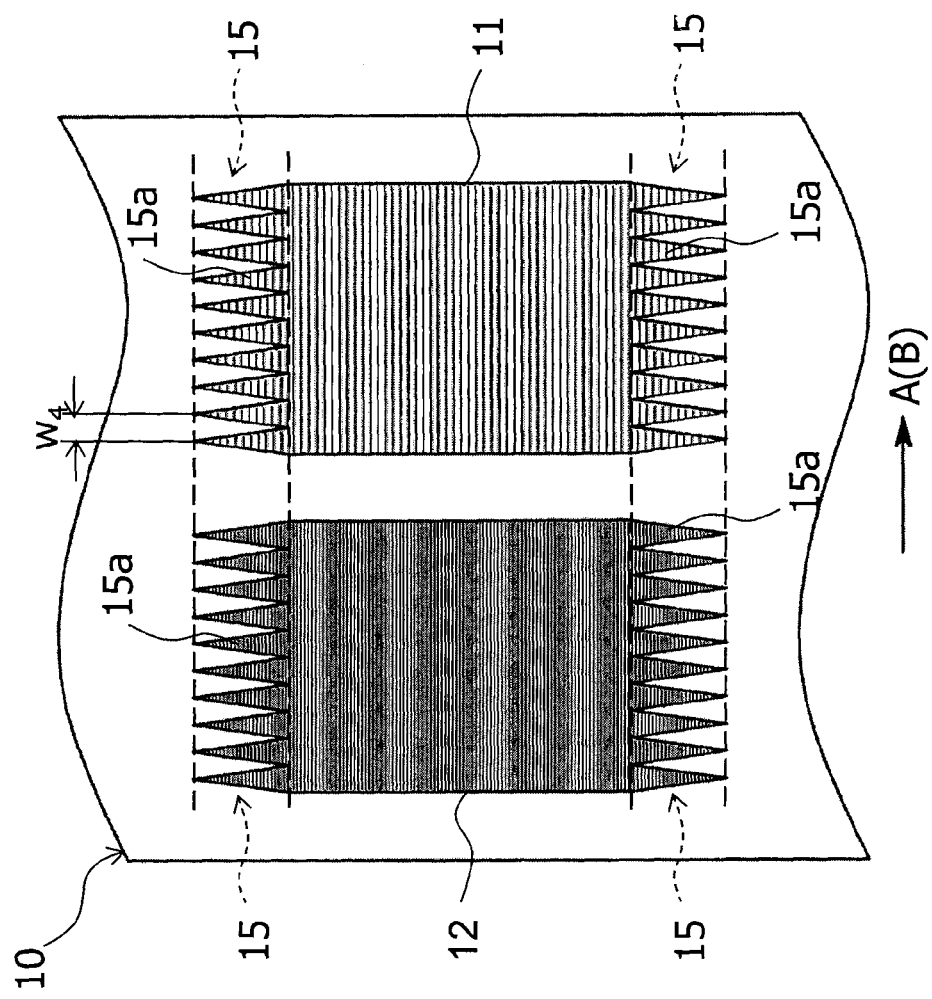

US 9,207,546 B2

EXPOSURE METHOD AND EXPOSURE APPARATUS

This application is a continuation of PCT/JP2010/071281, filed on Nov. 29, 2010.

BACKGROUND OF THE INVENTION

1. Field of the Invention

The present invention relates to an exposure method and an exposure apparatus for forming a different exposure pattern on each of a plurality of exposure areas arranged on an object to be exposed while conveying the object to be exposed at a constant speed in one direction, in particular, to an exposure method and an exposure apparatus for improving efficiency of forming a plurality of types of exposure patterns.

2. Description of Related Art

Conventionally, this type of exposure method is performed as follows. While conveying an object to be exposed in one direction, one mask pattern group of a photomask is selected and one exposure pattern group is formed by exposure on a predetermined exposure area on the object to be exposed by the one mask pattern group. Next, the object to be exposed is returned to a standby position, at which the object to be exposed is located before the exposure is started, and then the mask pattern group of the photomask is switched to another mask pattern group. Thereafter, the conveyance of the object to be exposed is restarted and another exposure pattern group is formed by exposure on another exposure area of the object to be exposed by the other mask pattern group (for example, refer to Japanese Laid-Open Patent Application No. 2008-310217).

However, in the conventional exposure method as described above, every time an exposure by one mask pattern group is completed, the object to be exposed is returned to the standby position, at which the object to be exposed is located before the exposure is started, so that the larger the number of types of exposure patterns to be formed, the longer the total moving distance of the object to be exposed until all exposures to the object to be exposed are completed. Therefore, there is a problem that forming exposure patterns is inefficient when forming a plurality of types of exposure patterns on the same object to be exposed.

SUMMARY OF THE INVENTION

Therefore, in view of the above conventional problems, an object of the present invention is to provide an exposure method and an exposure apparatus for improving the efficiency of forming a plurality of types of exposure patterns on the same object to be exposed.

In order to achieve the above object, the exposure method of the present invention is an exposure method for forming a different exposure pattern on each of a plurality of exposure areas arranged at predetermined intervals in a conveying direction of the object to be exposed while conveying the object to be exposed at a constant speed in one direction. The exposure method includes a step of moving a photomask by a predetermined distance and switching one mask pattern group to another mask pattern group when an exposure to one exposure area on the object to be exposed by the one mask pattern group of the photomask formed by arranging a plurality of types of mask pattern groups corresponding to the exposure patterns at predetermined intervals in the conveying direction of the object to be exposed is completed, and a step of performing an exposure on a next exposure area on the object to be exposed by the other mask pattern group. A moving speed of the photomask is controlled so that a moving distance of the object to be exposed is longer than a moving distance of the photomask in a period of time from when the photomask begins to move to switch the one mask pattern group to the other mask pattern group to when the photomask stops.

By the configuration as described above, while the object to be exposed is being conveyed at a constant speed in one direction, when an exposure to one exposure area on the object to be exposed by one mask pattern group of the photomask formed by arranging a plurality of types of mask pattern groups at predetermined intervals in the conveying direction of the object to be exposed is completed, the photomask is moved by a predetermined distance and the one mask pattern group is switched to another mask pattern group while controlling the moving speed of the photomask so that the moving distance of the object to be exposed is longer than the moving distance of the photomask, and an exposure on the next exposure area on the object to be exposed is performed by the other mask pattern group.

Preferably, the moving speed of the photomask is controlled to be switched to an acceleration phase in which the photomask is accelerated from a stopped state to a predetermined speed, a constant speed phase in which the photomask moves at the predetermined speed, and a deceleration phase in which the photomask decelerates and stops.

More preferably, the moving speed of the photomask in the constant speed phase is faster than a conveying speed of the object to be exposed.

The exposure apparatus of the present invention is an exposure apparatus for forming a different exposure pattern on each of a plurality of exposure areas arranged on an object to be exposed at predetermined intervals in a conveying direction of the object to be exposed while conveying the object to be exposed at a constant speed in one direction. The exposure apparatus includes a conveying device that conveys the object to be exposed at a predetermined speed, a mask stage which is provided to face an upper surface of the conveying device and which holds a photomask formed by arranging a plurality of types of mask pattern groups corresponding to the exposure patterns at predetermined intervals in a conveying direction of the object to be exposed and moves the photomask by a predetermined distance to switch one mask pattern group to another mask pattern group when an exposure to one exposure area on the object to be exposed by the one mask pattern group of the photomask is completed, and a control device that controls movement of the mask stage. The control device controls a moving speed of the mask stage so that a moving distance of the object to be exposed is longer than a moving distance of the photomask in a period of time from when the photomask begins to move to switch the one mask pattern group to the other mask pattern group to when the photomask stops.

By the configuration as described above, while the object to be exposed is being conveyed by the conveying device at a constant speed in one direction, when an exposure to one exposure area on the object to be exposed by one mask pattern group of the photomask formed by arranging a plurality of types of mask pattern groups at predetermined intervals in the conveying direction of the object to be exposed is completed, the photomask is moved by a predetermined distance and the one mask pattern group is switched to another mask pattern group while the control device controls the moving speed of the mask stage so that the moving distance of the object to be exposed is longer than the moving distance of the photomask, and an exposure on the next exposure area on the object to be exposed is performed by the other mask pattern group.

Preferably, the control device performs control to switch the moving speed of the mask stage to an acceleration phase in which the photomask is accelerated from a stopped state to a predetermined speed, a constant speed phase in which the photomask moves at the predetermined speed, and a deceleration phase in which the photomask decelerates and stops.

More preferably, the control device controls the moving speed of the mask stage in the constant speed phase to be faster than a conveying speed of the object to be exposed.

Furthermore, the photomask includes a first and a second photomasks, each of which includes a plurality of sets of the plurality of types of mask pattern groups which are aligned in a line at predetermined intervals, and the first and the second photomasks are shifted from each other by a predetermined distance in a direction substantially perpendicular to the conveying direction of the object to be exposed so that the plurality of sets of mask pattern groups are arranged in a direction substantially perpendicular to the conveying direction of the object to be exposed at a predetermined pitch in a staggered pattern.

Furthermore, in the same type of mask pattern groups of the plurality of types of mask pattern groups of the first and the second photomasks, mask patterns located in end regions of two mask pattern groups adjacent to each other as seen from the conveying direction of the object to be exposed overlap each other, and the mask patterns located in the end regions have shapes different from a shape of mask patterns located in a central portion of the mask pattern groups so that a predetermined amount of exposure can be obtained by a repeated exposure of the mask patterns corresponding to each other in the two mask pattern groups adjacent to each other.

Furthermore, the mask patterns located in an end region of the mask pattern groups of the first and the second photomasks are divided into a plurality of portions at predetermined pitches in a direction substantially perpendicular to the conveying direction of the object to be exposed.

Moreover, the mask patterns located in an end region of the mask pattern groups of the first and the second photomasks are divided into a plurality of small patterns at predetermined intervals in a direction substantially perpendicular to the conveying direction of the object to be exposed and sizes of the small patterns are set so that a sum of areas of the plurality of small patterns is a predetermined value.

According to a first aspect and a fourth aspect of the invention, which is different from the conventional technique, it is possible to form a different exposure pattern on each of a plurality of exposure areas while continuously moving the object to be exposed at a predetermined speed without returning the object to be exposed to a standby position, at which the object to be exposed is located before exposure is started, every time an exposure to a predetermined exposure area is completed. Therefore, the total moving distance of the object to be exposed until all exposures are completed is significantly shorter than that in the conventional technique. Therefore, it is possible to improve forming efficiency of a plurality of types of exposure patterns on the same object to be exposed compared with the conventional technique. The moving speed of the photomask is controlled so that the moving distance of the object to be exposed is longer than the moving distance of the photomask in a period of time from when the photomask begins to move to switch one mask pattern group to another mask pattern group to when the photomask stops. Thus, in a case in which, for example, a repeated exposure is performed by end regions of mask pattern groups arranged along the conveying direction of the object to be exposed, when the shapes of the mask patterns located in the end regions are changed from the shape of mask patterns located in a central portion of the mask pattern groups to avoid an over exposure by the repeated exposure of the end regions, it is possible to solve the problem that unexposed portions are generated corresponding to the end regions.

Furthermore, according to a second aspect and a fifth aspect of the invention, it is possible to prevent the unexposed portions from being generated even when a distance between a plurality of exposure areas in the conveying direction of the object to be exposed is smaller than a distance between the longitudinal center axes of a plurality of types of mask pattern groups of the photomask.

Furthermore, according to a third aspect and a sixth aspect of the invention, it is possible to expose the entire exposure areas by substantially the same amount of exposure while avoiding a still exposure state.

Furthermore, according to a seventh aspect of the invention, it is possible to form exposure patterns in a dense state.

Furthermore, according to an eight aspect of the invention, it is possible to prevent that the exposure area corresponding to the end regions is over exposed when the repeated exposure is performed by the end regions of the mask pattern groups arranged along the conveying direction of the object to be exposed.

Furthermore, according to a ninth aspect of the invention, it is possible to uniformize the exposure performed by the end regions of the mask pattern groups.

Then, according to a tenth aspect of the invention, it is possible to further uniformize the exposure performed by the end regions of the mask pattern groups.

BRIEF DESCRIPTION OF THE DRAWINGS

FIG. 4 is a plan view showing a shape example of a mask pattern located at an end region of a mask pattern group of the photomask;

FIGS. 5A and 5B are views showing exposure in which the photomask is moved at the same speed as that of the object to be exposed while the mask pattern group is switched when a distance between a first exposure area and a second exposure area of the object to be exposed is the same as a distance between the longitudinal center axes of a first and a second mask pattern groups of the photomask;

FIGS. 7A and 7B are views showing exposure in which the photomask is moved at the same speed as that of the object to be exposed while the mask pattern group is switched when the distance between the first exposure area and the second exposure area of the object to be exposed is smaller than the distance between the longitudinal center axes of the first and the second mask pattern groups of the photomask;

FIG. 8 is a plan view showing shapes of the first and the second mask pattern groups of the photomask according to the embodiment of the present invention;

DESCRIPTION OF THE PREFERRED EMBODIMENTS

Figure 1:
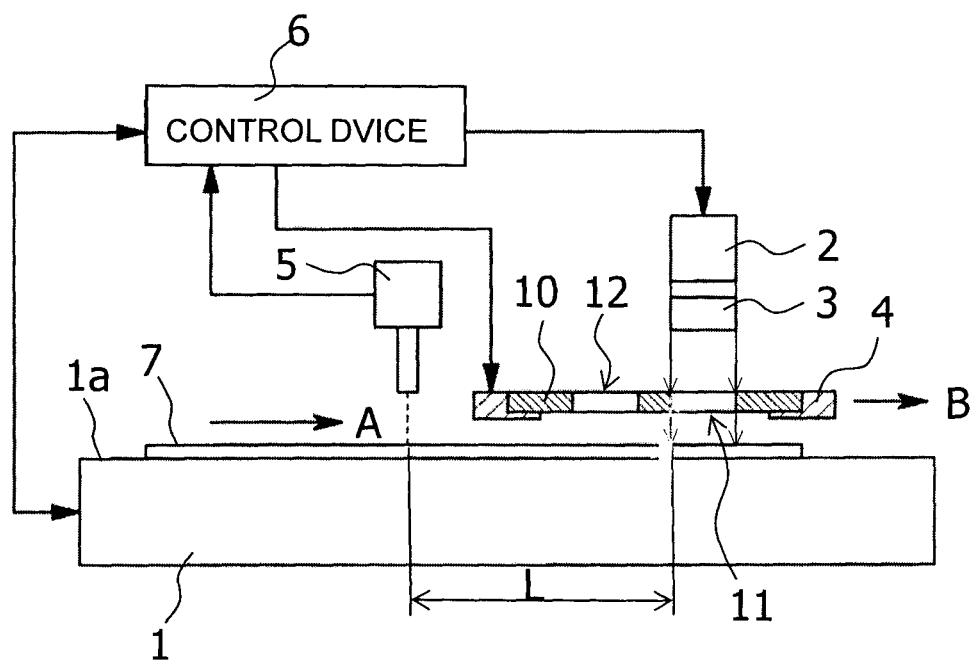
FIG. 1 is a schematic view showing an embodiment of an exposure apparatus according to the present invention.

Hereinafter, an embodiment of the present invention will be described in detail with reference to the attached drawings. FIG. 1 is a schematic view showing an embodiment of an exposure apparatus according to the present invention. The exposure apparatus forms a different exposure pattern on each of a plurality of exposure areas arranged on an object to be exposed while conveying the object to be exposed at a constant speed in one direction in a process of performing exposure. The exposure apparatus includes a conveying device 1, a light source 2, a coupling optical system 3, a mask stage 4, an imaging device 5, and a control device 6.

An object to be exposed 7 is placed on an upper surface 1a of the conveying device 1 and the conveying device 1 conveys the object to be exposed 7 in a direction indicated by an arrow A at a constant speed $V_G$. The conveying device 1 ejects and draws gas through the upper surface 1a and conveys the object to be exposed 7 while floating the object to be exposed 7 by a predetermined distance by balancing the ejecting force and the drawing force of the gas. The conveying device 1 is equipped with a speed sensor (not shown in the drawings) for detecting the moving speed $V_G$ of the object to be exposed 7 and a position sensor (not shown in the drawings) for detecting the position of the object to be exposed 7.

Figure 2:
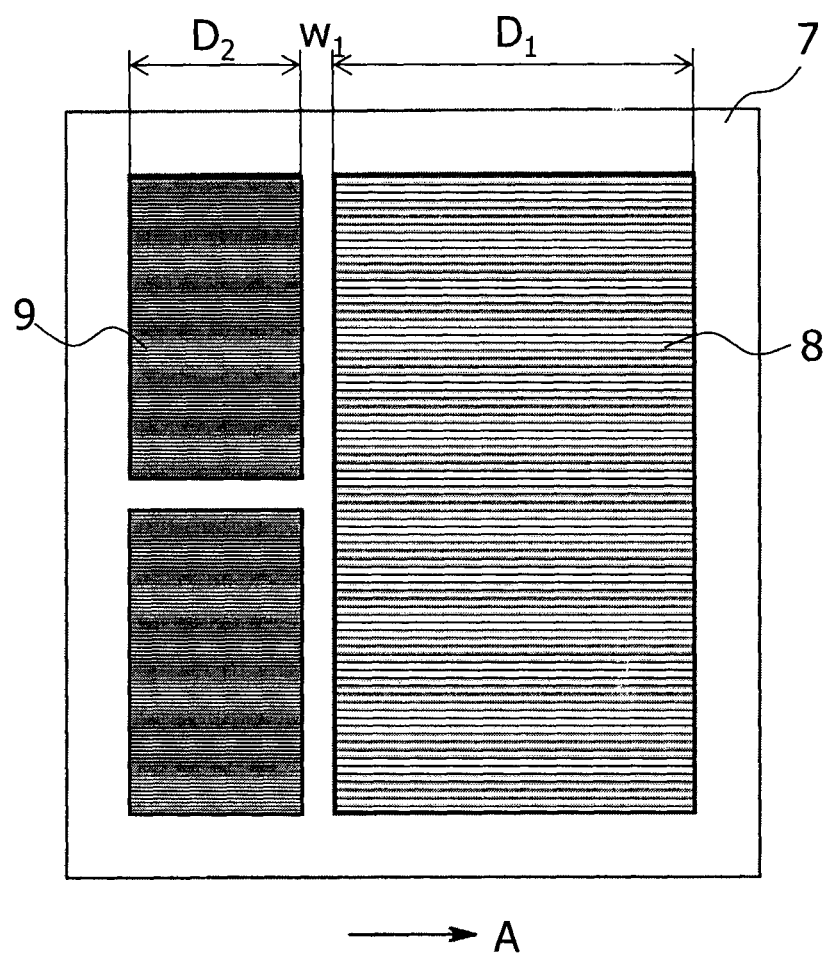
FIG. 2 is a plan view showing an arrangement example of a plurality of exposure areas arranged on a surface of an object to be exposed which is used in the exposure apparatus.

As shown in FIG. 2, a first exposure area 8 on which a first exposure pattern group will be formed and a second exposure area 9 on which a second exposure pattern group will be formed are arranged in advance on the object to be exposed 7 used here with a distance $W_1$ in between in the conveying direction (direction indicated by the arrow A). The object to be exposed 7 is a color filter substrate or the like in which, for example, a plurality of display panels having different sizes are attached to one large glass substrate.

The light source 2 is provided above the conveying device 1. The light source 2 irradiates ultraviolet rays. The light source 2 is a xenon lamp, an extra high pressure mercury lamp, a laser, or the like.

The coupling optical system 3 is provided in front of the light source 2 in a direction in which the light is irradiated. The coupling optical system 3 converts the light irradiated from the light source 2 into parallel light and irradiates the parallel light to a mask pattern group of a photomask 10 described later. The coupling optical system 3 includes optical components such as a photo integrator and a condenser lens. The coupling optical system 3 further includes a mask for shaping a cross-sectional shape of the light according to an outer shape of a forming area of each mask pattern group of the photomask 10.

The mask stage 4 is provided to face the upper surface of the conveying device 1. The mask stage 4 holds a marginal edge portion of the photomask 10 formed by arranging a first and a second mask pattern groups 11 and 12 (see FIG. 3) that respectively corresponds to different types of the first and the second exposure pattern groups formed on the object to be exposed 7 with a distance $W_2$ (see FIG. 3) smaller than the distance $W_1$ between the first and the second exposure areas 8 and 9 arranged on the object to be exposed 7, in between in the conveying direction of the object to be exposed 7 (direction indicated by the arrow A).

When an exposure that is performed on the first exposure area 8 on the object to be exposed 7 by using the mask pattern group 11 of the photomask 10 is completed, the mask stage 4 switches the first mask pattern group 11 to the second mask pattern group 12 by moving the photomask 10 in the same direction (indicated by an arrow B) as the conveying direction of the object to be exposed 7 (direction indicated by the arrow A) by a distance corresponding to a distance $W_3$ (see FIG. 3) between the longitudinal center axes of the first and the second mask pattern groups 11 and 12. The mask stage 4 is equipped with a speed sensor and a position sensor not shown in the drawings.

Figure 3:
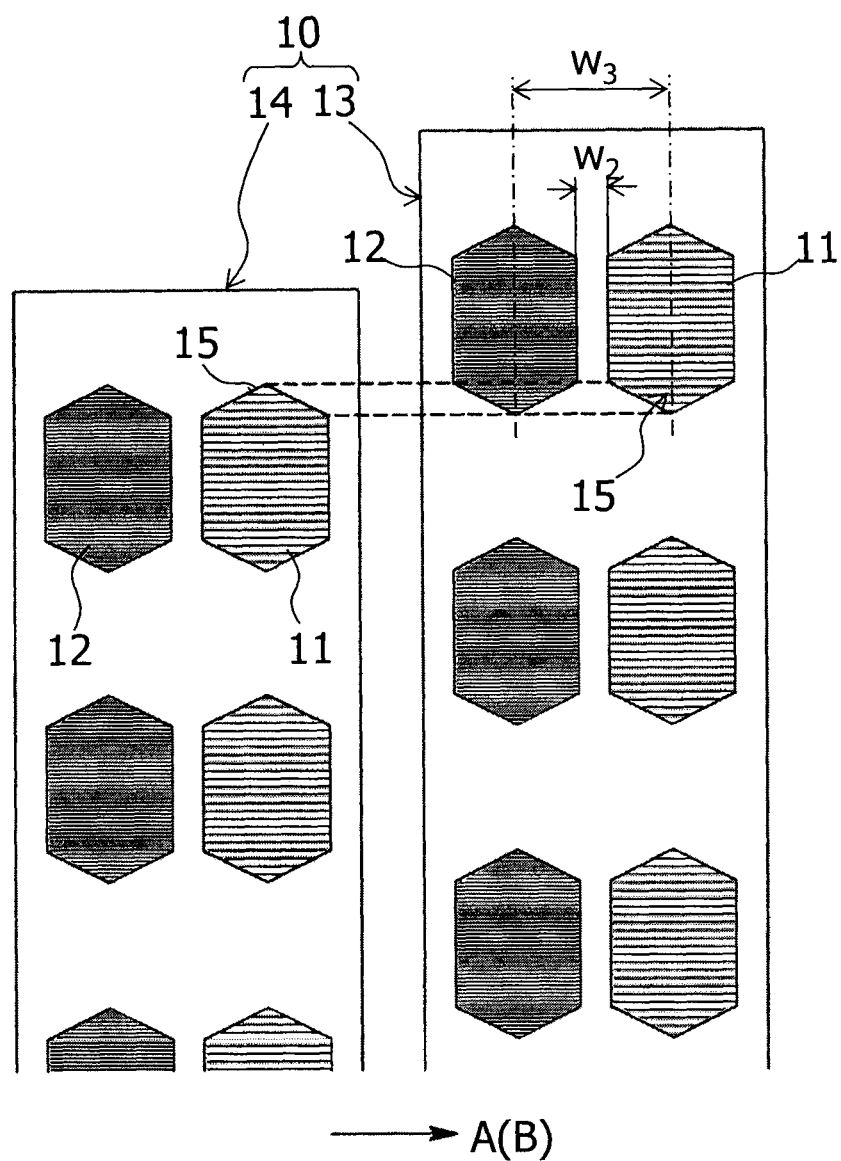
FIG. 3 is a plan view showing a configuration example of a photomask used in the exposure apparatus.

Here, as shown in FIG. 3, the photomask 10 includes a first and a second photomasks 13 and 14 each of which includes a plurality of pairs of the first and the second mask pattern groups 11 and 12 which are aligned in a line at predetermined intervals. The first and the second photomasks 13 and 14 are shifted from each other by a predetermined distance in a direction substantially perpendicular to the conveying direction of the object to be exposed 7 (direction indicated by the arrow A) so that the plurality of pairs of the first and the second mask pattern groups 11 and 12 are arranged in a direction substantially perpendicular to the conveying direction of the object to be exposed 7 (direction indicated by the arrow A) at a predetermined pitch in a staggered pattern.

In this case, in the same type of mask pattern groups of the two types of mask pattern groups 11 and 12 of the first and the second photomasks 13 and 14, for example, in the first mask pattern groups 11, an end region (a portion sandwiched by two dashed lines in FIG. 3) 15 of one first mask pattern group 11 overlaps an end region 15 of a first mask pattern group 11 adjacent to the first mask pattern group 11 as seen from the conveying direction of the object to be exposed 7 (direction indicated by the arrow A) and positions of mask patterns 16 (see FIG. 4) in the two end regions 15 correspond to each other in the direction indicated by the arrow A. The mask patterns 16 located in the end region 15 have shapes different from the shape of the mask patterns 16 located in the central portion of the first mask pattern group 11 so that a predetermined amount of exposure can be obtained by a repeated exposure of the mask patterns 16 corresponding to each other of two first mask pattern groups 11 adjacent to each other.

In particular, as shown in FIG. 4, the mask patterns 16 are formed an elongated rectangular shape in the direction indicated by the arrow A so that a length along the long axis of the mask pattern 16 located in the triangle-shaped end region 15 becomes progressively shorter as the position of the mask pattern 16 along the longitudinal center axis of the first mask pattern group 11 becomes closer to the outside. A sum of opening areas of two mask patterns 16a and 16b corresponding to each other located in the end regions 15 of two first mask pattern groups 11 adjacent to each other in the direction indicated by the arrow A is substantially the same as an opening area of a mask pattern 16c located in the central portion of the first mask pattern group 11. Thereby, the amount of repeated exposure by the two mask patterns 16a and 16b aligned in the direction indicated by the arrow A in the end regions 15 of the first mask pattern groups 11 is substantially the same as the amount of exposure by the mask pattern 16c in the central portion of the first mask pattern group 11, so that over exposure is avoided.

To form different exposure patterns on two exposure areas on the object to be exposed 7 by using the photomask 10 described above, when the exposure to the first exposure area 8 on the object to be exposed 7 by the first mask pattern group 11 is completed, the photomask 10 is moved by the distance $W_3$ in the same direction (direction indicated by the arrow B) as the conveying direction of the object to be exposed 7 (direction indicated by the arrow A) to switch the first mask pattern group 11 to the second mask pattern group 12, and then the exposure to the second exposure area 9 on the object to be exposed 7 is performed by the second mask pattern group 12.

In this case, when the distance $W_1$ between the first exposure area 8 and the second exposure area 9 is larger than or equal to the distance $W_3$ between the longitudinal center axes of the first and the second mask pattern groups 11 and 12 of the photomask 10, the photomask 10 may be moved at a speed slower than or equal to the moving speed $V_G$ of the object to be exposed 7 while the first mask pattern group 11 is switched to the second mask pattern group 12.

FIG. 5 is a view showing the exposure in which the photomask 10 is moved at a moving speed $V_M$ that is the same as the moving speed $V_G$ of the object to be exposed 7 when the distance $W_1$ between the first exposure area 8 and the second exposure area 9 of the object to be exposed 7 is the same as the distance $W_3$ between the longitudinal center axes of the first and the second mask pattern groups 11 and 12 of the photomask 10. According to FIG. 5, when a rear end portion 8a located upstream in the direction indicated by the arrow A of the first exposure area 8 on the object to be exposed 7 corresponds to the longitudinal center axis of the first mask pattern group 11 of the photomask 10 (see FIG. 5A. At this time, a front end portion 9a located downstream in the direction indicated by the arrow A of the second exposure area 9 corresponds to the longitudinal center axis of the second mask pattern group 12), if the photomask 10 begins to be moved in the direction indicated by the arrow B to switch the mask pattern group (see FIG. 5B), an exposure can be performed on the entire area of the first exposure area 8 by the first mask pattern group 11 and an exposure can be performed on the entire area of the second exposure area 9 by the second exposure pattern group.

Figures 6A, 6B:
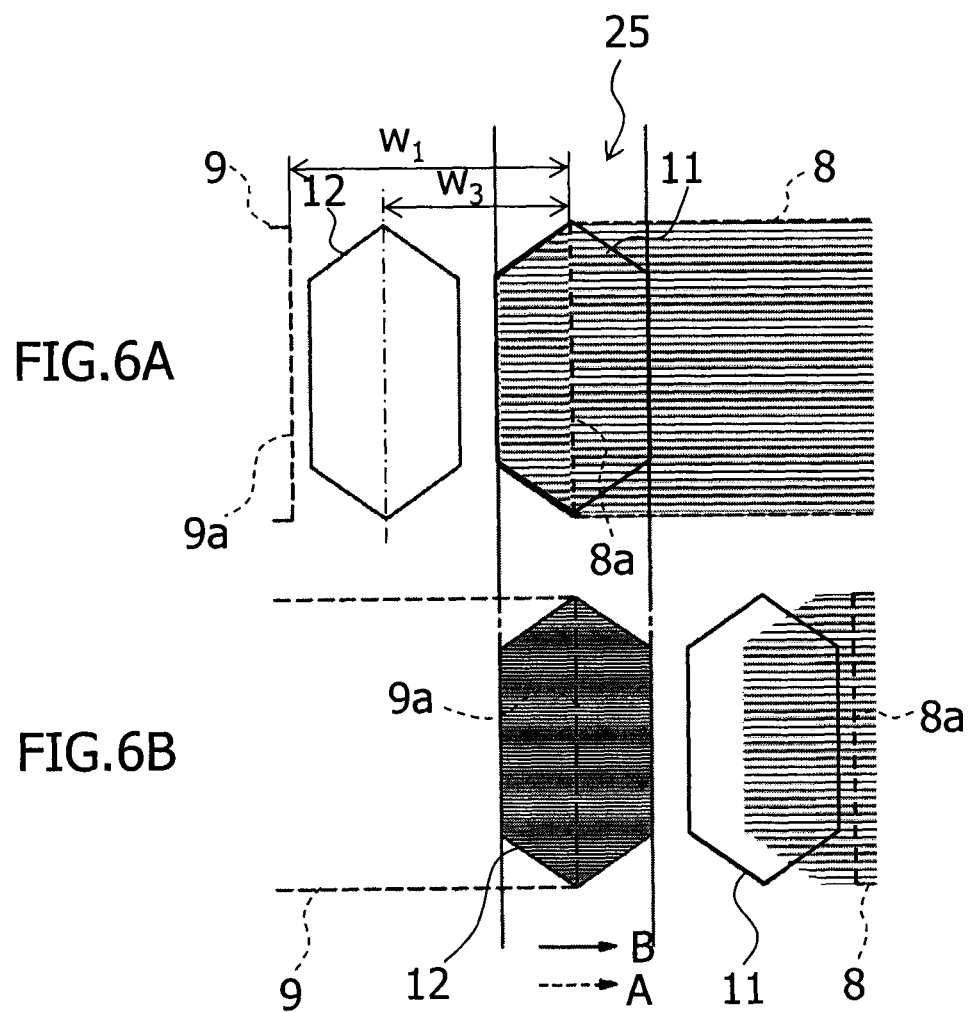
FIGS. 6A and 6B are views showing exposure in which the photomask is moved at a speed slower than that of the object to be exposed while the mask pattern group is switched when the distance between the first exposure area and the second exposure area of the object to be exposed is larger than the distance between the longitudinal center axes of the first and the second mask pattern groups of the photomask.

FIG. 6 is a view showing the exposure in which the photomask 10 is moved at a moving speed $V_M$ that is slower than the moving speed $V_G$ of the object to be exposed 7 when the distance $W_1$ between the first exposure area 8 and the second exposure area 9 of the object to be exposed 7 is larger than the distance $W_3$ between the longitudinal center axes of the first and the second mask pattern groups 11 and 12 of the photomask 10. According to FIG. 6, when the rear end portion 8a in the direction indicated by the arrow A of the first exposure area 8 on the object to be exposed 7 corresponds to the longitudinal center axis of the first mask pattern group 11 of the photomask 10 (see FIG. 6A), if the photomask 10 begins to be moved in the direction indicated by the arrow B to switch the mask pattern group (see FIG. 6B), it is possible to cause the front end portion 9a in the direction indicated by the arrow A of the second exposure area 9 of the object to be exposed 7 to correspond to the longitudinal center axis of the second mask pattern group 12 of the photomask 10 when or after the switching is completed. Therefore, also in this case, an exposure can be performed on the entire area of the first exposure area 8 by the first mask pattern group 11 and an exposure can be performed on the entire area of the second exposure area 9 by the second mask pattern group 12.

However, as shown by the object to be exposed 7 of the present embodiment shown in FIGS. 7A and 7B, when the distance $W_1$ between the first exposure area 8 and the second exposure area 9 is smaller than the distance $W_3$ between the longitudinal center axes of the first and the second mask pattern groups 11 and 12 of the photomask 10, as shown in FIGS. 7A and 7B, if the photomask 10 is moved at a moving speed $V_M$ that is the same as the moving speed $V_G$ of the object to be exposed 7 while switching the mask pattern group, an unexposed portion 17 is generated in a part of the rear end portion 8a in the direction indicated by the arrow A of the first exposure area 8 or the front end portion 9a of the second exposure area 9. When the photomask 10 is moved at a moving speed $V_M$ slower than the moving speed $V_G$ of the object to be exposed 7 while the first mask pattern group 11 is switched to the second mask pattern group 12, the front end portion 9a in the direction indicated by the arrow A of the second exposure area 9 goes beyond the longitudinal center axis of the second mask pattern group 12 before the first mask pattern group 11 is switched to the second mask pattern group 12, so that an unexposed portion 17 is generated in a part of the front end portion 9a of the second exposure area 9.

Therefore, in the present embodiment, as shown in FIG. 8, an end region 15 which overlaps the adjacent mask pattern group in the direction indicated by the arrow A in the same type of mask pattern group is divided into a plurality of portions (divided into 10 portions in FIG. 8) at a pitch $W_4$ in a direction substantially perpendicular to the direction indicated by the arrow A, and each small unit 15a formed by dividing the end region 15 is shaped into a triangle. At the same time, the moving speed $V_M$ of the mask pattern 16 is switched to an acceleration phase in which the moving speed is accelerated from a stopped state to a predetermined speed (which is the same speed as the moving speed $V_G$ of the object to be exposed 7 in the present embodiment), a constant speed phase in which the mask pattern 16 is moved at the predetermined speed, and a deceleration phase in which the mask pattern decelerates and stops. In the acceleration phase and the deceleration phase, the photomask 10 is moved by at least the same distance as the division size $W_4$ of the end region 15 of the mask pattern groups 11 and 12. Thereby, even when the distance $W_1$ between the first exposure area 8 and the second exposure area 9 is smaller than the distance $W_3$ between the longitudinal center axes of the first and the second mask pattern groups 11 and 12, an exposure can be performed on the entire area of the first exposure area 8 by the first mask pattern group 11 and an exposure can be performed on the entire area of the second exposure area 9 by the second exposure pattern group without generating an unexposed portion 17 (see FIG. 11A to 11D).

The imaging device 5 is provided to capture an image of a position upstream of an exposure area of the photomask 10 in the conveying direction. The imaging device 5 captures an image of the surface of the object to be exposed 7. The imaging device 5 is a line camera in which a plurality of light receiving elements are aligned in a line in a direction substantially perpendicular to the conveying direction (indicated by the arrow A) in a plane parallel with the upper surface 1a of the conveying device 1. A distance between an imaging center of the imaging device 5 and a rear end located upstream in the direction indicated by the arrow A of an exposure light irradiation area of the photomask 10 when the mask stage 4 is in a stopped state is set to a distance L.

Figure 9:
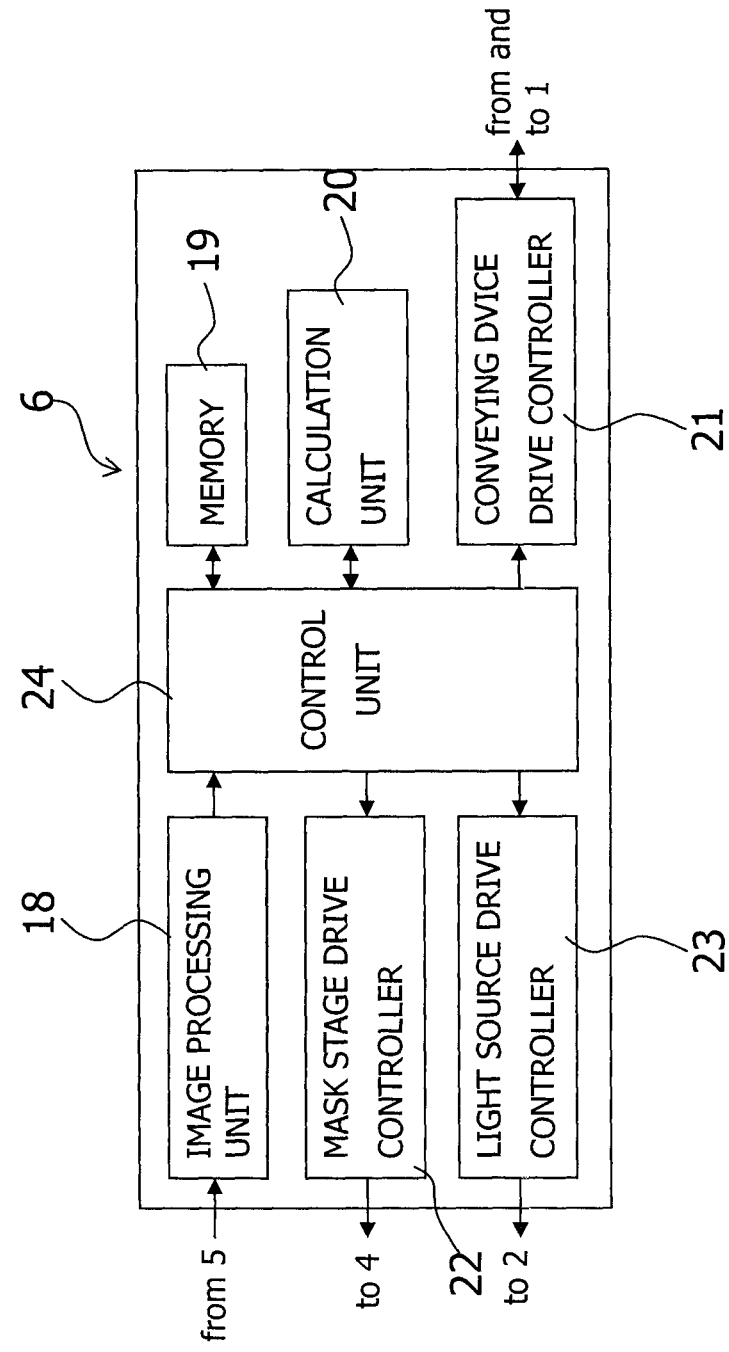
FIG. 9 is a block diagram showing a schematic configuration of a control device of the exposure apparatus.

The control device 6 is provided and electrically connected to the conveying device 1, the light source 2, the mask stage 4, and the imaging device 5. The control device 6 controls the moving speed $V_M$ of the mask stage 4 so that a moving distance of the object to be exposed 7 is longer than a moving distance of the photomask 10 in a period of time from when the photomask 10 begins to move to switch the first mask pattern group 11 to the second mask pattern group 12 to when the photomask 10 stops. As shown in FIG. 9, the control device 6 includes an image processing unit 18, a memory 19, a calculation unit 20, a conveying device drive controller 21, a mask stage drive controller 22, a light source drive controller 23, and a control unit 24.

The image processing unit 18 processes an image of the surface of the object to be exposed 7, which is captured by the imaging device 5, and detects a front position located downstream of each exposure area in the conveying direction. The memory 19 stores lengths $D_1$ and $D_2$ of each exposure area in the direction indicated by the arrow A, the distance L between the imaging center of the imaging device 5 and the rear end located upstream of the exposure light irradiation area of the photomask 10 in the direction indicated by the arrow A, and a control profile of the moving speed $V_G$ of the object to be exposed 7 and the moving speed $V_M$ of the mask stage 4, and temporarily stores a calculation result of the calculation unit 20 described later. Furthermore, the calculation unit 20 calculates a moving distance of the object to be exposed 7 on the basis of an output of the position sensor of the conveying device 1 and calculates a moving distance of the photomask 10 on the basis of an output of the position sensor of the mask stage 4. The conveying device drive controller 21 controls the stage of the conveying device 1 to move at a constant speed $V_G$. The mask stage drive controller 22 controls the movement of the mask stage 4 on the basis of the control profile stored in the memory 19. The light source drive controller 23 controls drive for turning on and off the light source 2. The control unit 24 integrally controls the above components so that each component operates properly.

Figure 10:
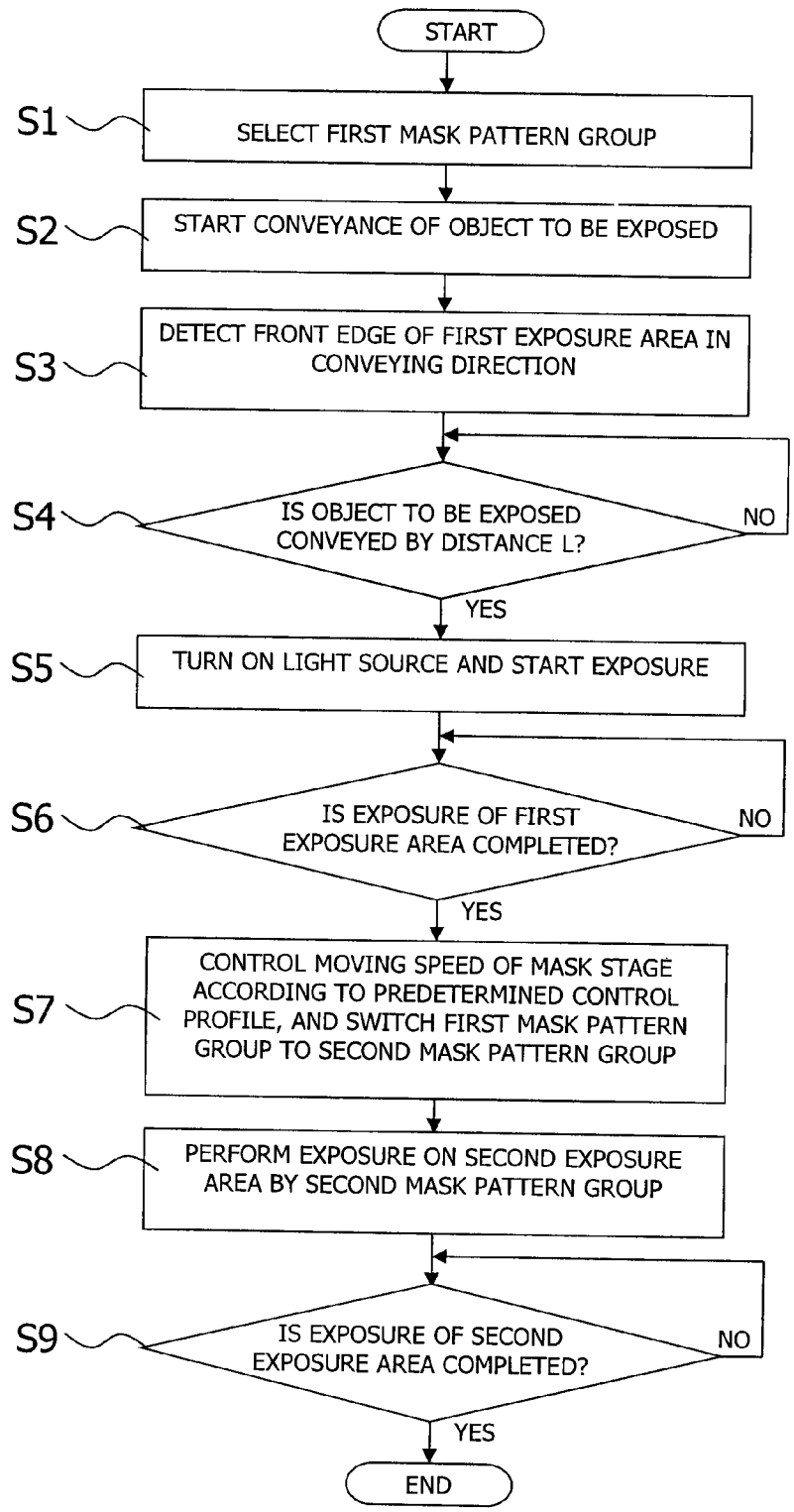
FIG. 10 is a flowchart showing an exposure method of the present invention.

Next, the operation of the exposure apparatus configured as described above will be described with reference to FIG. 10.

First, in step S1, the mask stage 4 stops and the first mask pattern group 11 of the photomask 10 is selected.

In step 2, the conveying device drive controller 21 controls the conveying device 1 to begin to move and the conveying device 1 conveys the object to be exposed 7 at a constant speed $V_G$ in the direction indicated by the arrow A.

In step S3, the image processing unit 18 processes an image of the surface of the object to be exposed 7, which is captured by the imaging device 5, and detects an front edge located downstream in the direction indicated by the arrow A of, for example, a reference pattern such as pixels formed in the first exposure area 8 in advance in the front end portion located downstream of the first exposure area 8 in the direction indicated by the arrow A.

In step S4, the calculation unit 20 calculates a distance which the object to be exposed 7 moves from when the front end portion located downstream of the first exposure area 8 in the direction indicated by the arrow A is detected on the basis of the output of the position sensor of the conveying device 1. If the moving distance of the object to be exposed 7 corresponds to the distance L read from the memory 19 and "YES" is determined in step S4, the process proceeds to step S5.

In step S5, the light source drive controller 23 starts and turns on the light source 2. Thereby, the first mask pattern group 11 of the photomask 10 is irradiated with light irradiated from the light source 2 and converted into parallel light through the coupling optical system 3, and having the cross-sectional shape of which is formed into a rectangular shape according to the outer shape of the mask pattern group. Thereby, an image of a pattern corresponding to the first mask pattern group 11 of the photomask 10 is exposed to the first exposure area 8 of the object to be exposed 7 and a first exposure pattern is formed. At this time, a repeated exposure is performed by the end region 15 of the first mask pattern group 11 of the second photomask 14 by tracing exposure paths of the end region 15 of the first mask pattern group 11 of the first photomask 13, and an exposure of a predetermined depth is performed.

In step S6, the moving distance of the object to be exposed 7 is calculated by the calculation unit 20 on the basis of the output of the position sensor of the conveying device 1 and it is determined whether or not the moving distance corresponds to the length $D_1$ in the direction indicated by the arrow A of the first exposure area 8 read from the memory 19 and the exposure to the first exposure area 8 is completed. Here, if the distance and the length correspond to each other and "YES" is determined in step S6, the process proceeds to step S7. In the present embodiment, as shown in FIG. 11A, when the object to be exposed 7 moves a distance ($D_1+W_4$) ($W_4$ is the division size of the first mask pattern group 11), it is determined that the exposure to the first exposure area 8 is completed.

Figure 12:
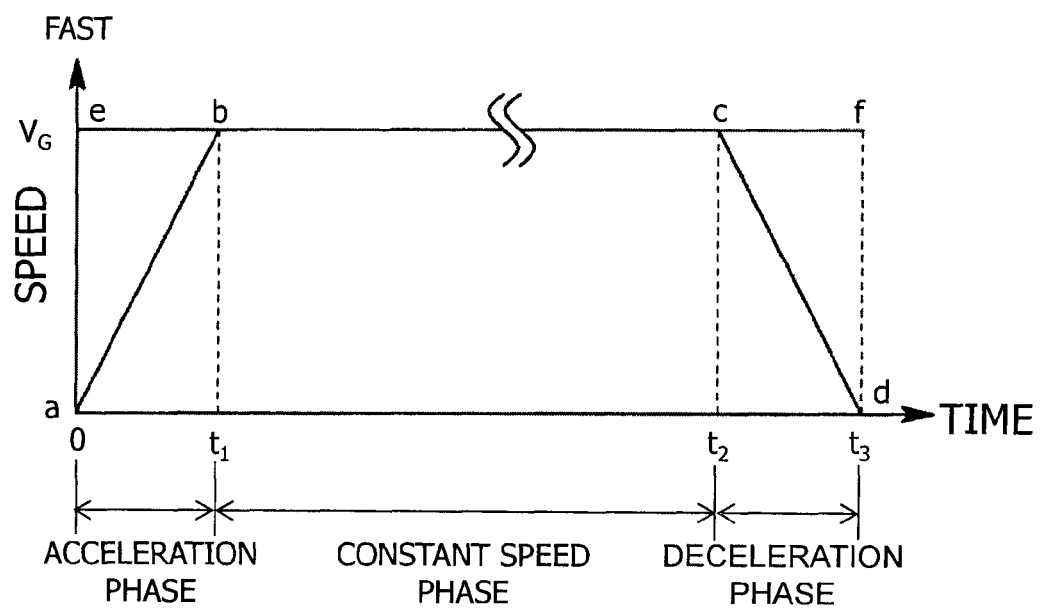
FIG. 12 is a view showing an example of a control profile of movement of a mask stage according to the present invention.

In step S7, the mask stage drive controller 22 starts, controls the movement of the mask stage 4 according to the control profile shown in FIG. 12, and switches the first mask pattern group 11 to the second mask pattern group 12.

Figure 11:
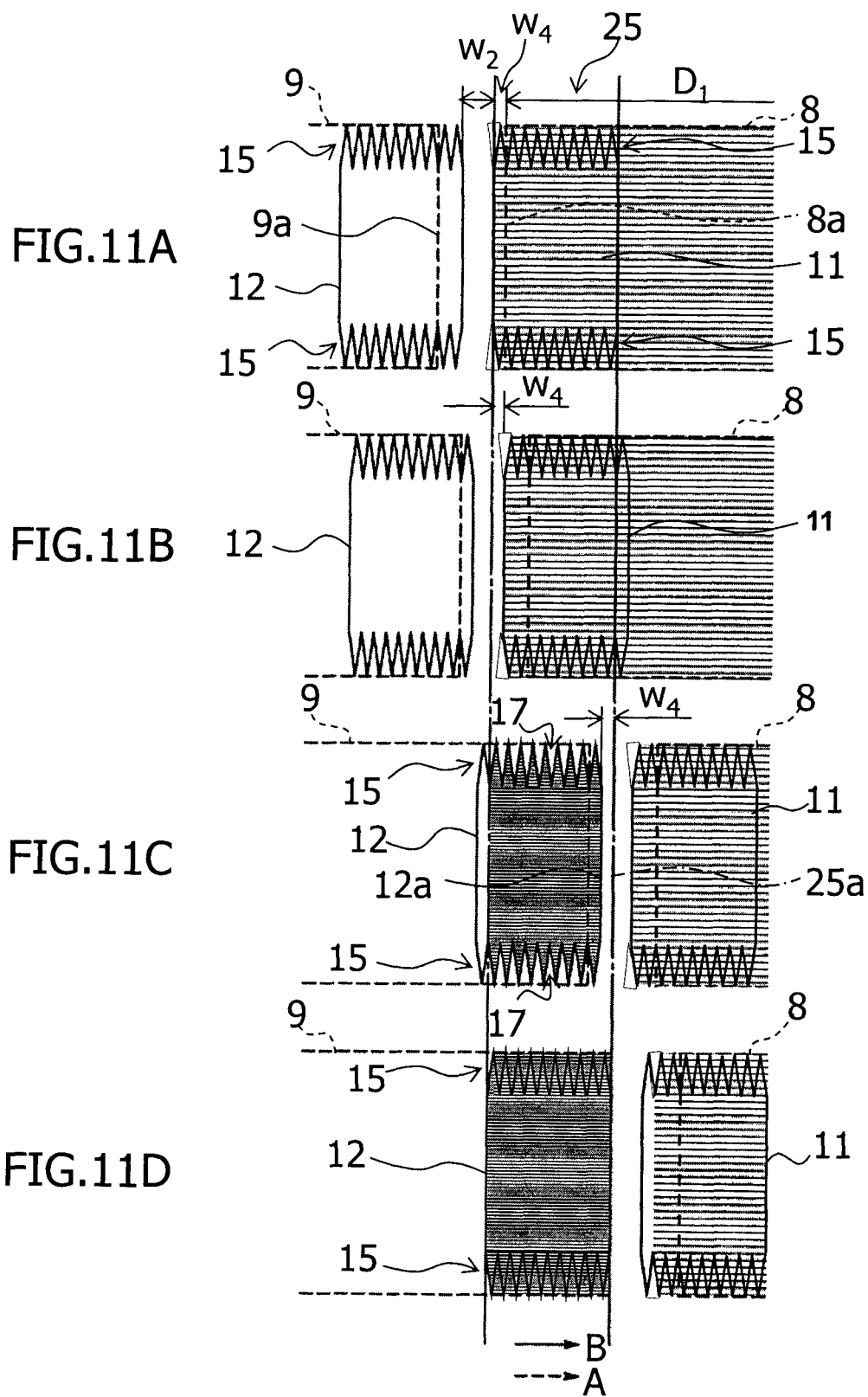
FIG. 11A to 11D are views showing an exposure method of the present invention.

Hereinafter, the exposure method of the present invention will be described with reference to FIGS. 11 and 12.

First, as shown in FIG. 11A, when the exposure to the first exposure area 8 by the first mask pattern group 11 is completed, the mask stage 4 begins to move in the direction indicated by the arrow B. At this time, as shown in FIG. 12, the moving speed of the mask stage 4 is accelerated to the same speed as the moving speed $V_G$ of the object to be exposed 7 after a time $t_1$ elapses. Therefore, the moving distance of the photomask 10, which moves in the acceleration phase, is ($V_G \cdot t_1 / 2$), which is a half of the moving distance ($V_G \cdot t_1$) of the object to be exposed 7. Therefore, if the acceleration time $t_1$ is set in advance so that the moving distance of the photomask 10 in the acceleration phase is $W_4$ as shown in FIG. 11B, the object to be exposed 7 further advances by $2W_4$ when the acceleration is completed as shown in FIG. 11B. Thereby, the first exposure area 8 corresponding to the end region 15 of the first mask pattern group 11 is uniformly exposed without generating an unexposed portion 17.

When the acceleration phase is completed, the mask stage 4 proceeds to the constant speed phase as shown in FIG. 12. At this time, the mask stage 4 moves at the same speed as the moving speed $V_G$ of the object to be exposed 7. Here, if a time ($t_2-t_1$) is set in advance so that the moving distance of the mask stage 4 in the constant speed phase is, for example, ($W_2+8W_4$), as shown in FIG. 11C, the photomask 10 moves at the same speed as the moving speed $V_G$ of the object to be exposed 7 until a front end portion 12a located downstream in the direction indicated by the arrow A of the second mask pattern group 12 of the photomask 10 reaches a position a distance $W_4$ upstream of a front end portion 25a located downstream in the direction indicated by the arrow A of a light irradiation area 25. Therefore, the exposure in the constant speed phase is the same as a still exposure, so that, as shown in FIG. 11C, the shape of the second mask pattern group 12 is transferred to the second exposure area 9 and unexposed portions 17 are generated corresponding to the end regions 15 of the second mask pattern group 12.

When the constant speed phase is completed, the mask stage 4 proceeds to the deceleration phase as shown in FIG. 12 and the mask stage 4 gradually decreases the speed and stops after a time $(t_3-t_2)$ elapses. At this time, if $(t_3-t_2)$ is set to $t_1$, as shown in FIG. 11D, the mask stage 4 stops after advancing by the distance $W_4$ in the deceleration phase. On the other hand, during the deceleration phase, the object to be exposed 7 moves a distance $2W_4$, which is two times the moving distance of the mask stage 4, so that, as shown in FIG. 11D, the unexposed portions 17 of the second exposure area 9 are exposed by the end regions 15 of the second mask pattern group 12.

As describe above, the distance which the mask stage 4 moves from when the mask stage 4 begins to move to when the mask stage 4 stops corresponds to the area of the trapezoid abcd in FIG. 12, so that the distance is $V_G \cdot t_2$. In FIG. 11A to 11D, the distance is $(W_2+10W_4)$, which is the same as the distance $W_3$ between the longitudinal center axes of the first and the second mask pattern groups 11 and 12, so that the switching of the mask pattern groups is appropriately performed.

On the other hand, the distance which the object to be exposed 7 moves from when the mask stage 4 begins to move to when the mask stage 4 stops corresponds to the area of the rectangle aefd in FIG. 12, so that the distance is $V_G \cdot t_3$. In FIGS. 11A and 11B, the distance is $(W_2+12W_4)$, which is longer than the moving distance of the mask stage 4.

In this way, when the exposure to the first exposure area 8 on the object to be exposed 7 by the mask pattern group 11 of the photomask 10 is completed and the first mask pattern group 11 is switched to the second mask pattern group 12, the moving speed of the photomask 10 is controlled so that the moving distance of the object to be exposed 7 is longer than the moving distance of the photomask 10. Thus, it is possible to prevent the unexposed portions 17 from being generated corresponding to the end regions 15 of the first and the second mask pattern groups 11 and 12 of the photomask 10. In particular, the movement of the photomask 10 is controlled according to the control profile of acceleration, constant speed, and deceleration, so that, even when the distance $W_1$ between the first and the second exposure areas 8 and 9 of the object to be exposed 7 is smaller than the distance $W_3$ between the longitudinal center axes of the first and the second mask pattern groups 11 and 12 of the photomask 10, it is possible to prevent the unexposed portions 17 from being generated in portions of the exposure area corresponding to the end regions 15 of the mask pattern groups.

When the switching of the mask pattern groups of the photomask 10 is completed in this way, the process proceeds to step S8 and an exposure is performed on the second exposure area 9 on the object to be exposed 7 by the second mask pattern group 12 of the photomask 10.

In step S9, the moving distance of the object to be exposed 7 is calculated by the calculation unit 20 on the basis of the output of the position sensor of the conveying device 1 and it is determined whether or not the moving distance corresponds to the length $D_2$ in the direction indicated by the arrow A of the second exposure area 9 read from the memory 19 and the exposure to the second exposure area 9 is completed. Here, if the distance and the length correspond to each other and "YES" is determined, the exposure is completed. Then, the light source 2 is controlled to be turned off by the light source drive controller 23 and the drive of the conveying device 1 is controlled to be stopped by the conveying device drive controller 21. Here, when a plurality of objects to be exposed 7 are sequentially conveyed and exposure is continuously performed on the plurality of objects to be exposed 7, the conveying device 1 is continuously driven.

Although, in the present embodiment, a case is described in which the moving speed $V_M$ of the photomask 10 at the constant speed is set to be the same as the moving speed $V_G$ of the object to be exposed 7, the present invention is not limited to this, and the moving speed $V_M$ of the photomask 10 at the constant speed may be set to be faster than the moving speed $V_G$ of the object to be exposed 7.

Figure 13:
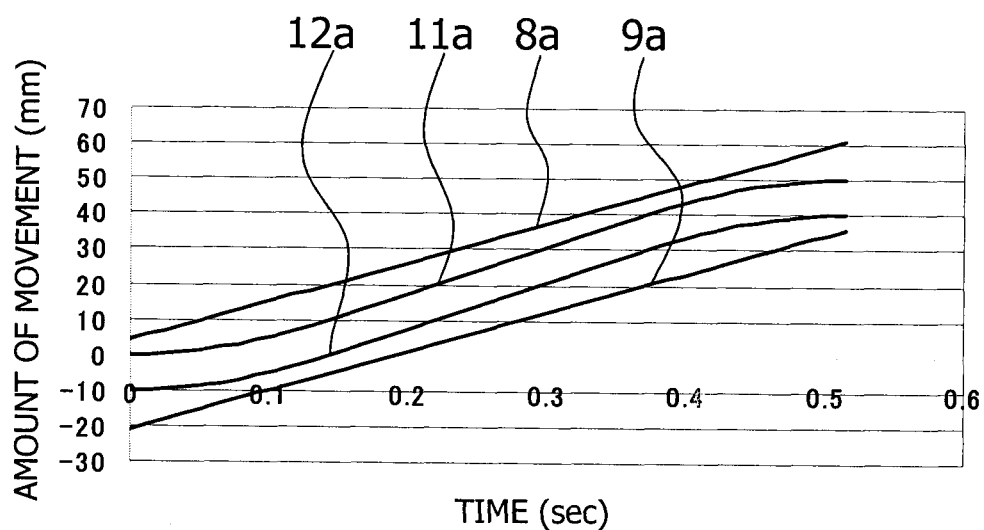
FIG. 13 is a graph showing a relationship between an amount of movement of the object to be exposed and an amount of movement of the photomask according to another control example of the present invention.

FIG. 13 is a graph showing a relationship between the amount of movement of the object to be exposed 7 and the amount of movement of the photomask 10 according to another control example of the present invention.

FIG. 13 is a graph calculated by assuming that the photomask 10 shown in FIG. 8 is used, the acceleration of the photomask 10 is 1000 mm/sec$^2$, the moving speed $V_M$ of the photomask 10 at the constant speed is 130 mm/sec, the moving distance of the photomask 10 is 50 mm, and the moving speed $V_G$ of the object to be exposed 7 is 110 mm/sec. In this case, the distance $W_1$ between the first exposure area 8 and the second exposure area 9 of the object to be exposed 7 is 25 mm and the width in the direction indicated by the arrow A of the first and the second mask pattern groups 11 and 12 of the photomask 10 is 40 mm. Immediately before the photomask 10 begins to move, the rear end portion 8a in the direction indicated by the arrow A of the first exposure area 8 on the object to be exposed 7 advances in the direction indicated by the arrow A 4.2 mm farther than the rear end portion 11a in the direction indicated by the arrow A of the first mask pattern group 11 of the photomask 10.

Figure 14:
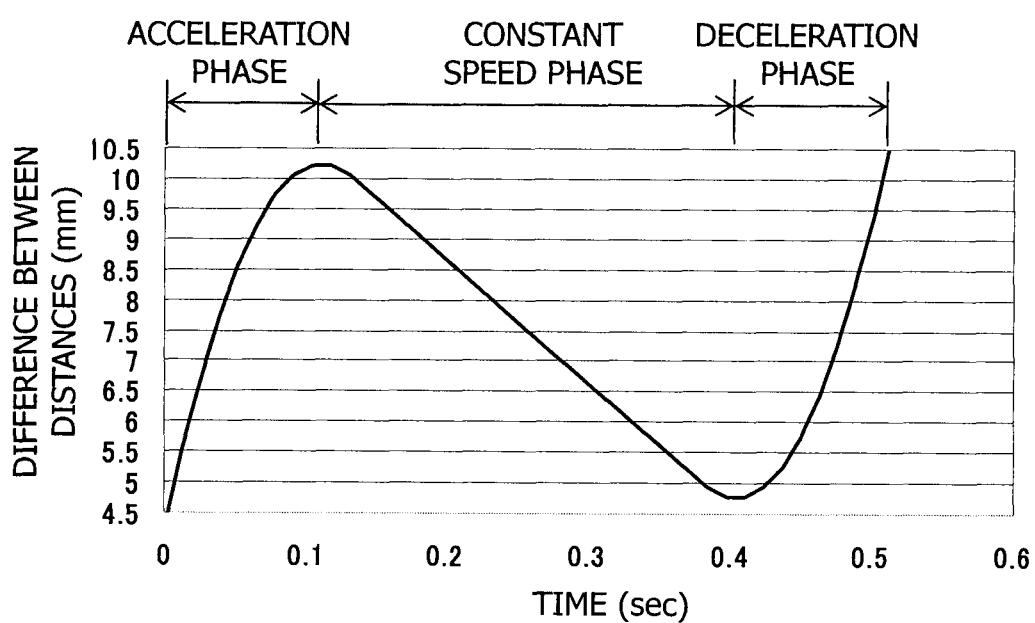
FIG. 14 is a graph showing variation of difference between the moving distances of the object to be exposed and the photomask in the control of FIG. 13.

As a result, while the photomask 10 moves 50 mm and the first mask pattern group 11 is switched to the second mask pattern group 12, the distance which the object to be exposed 7 moves is 56.6 mm. The moving speed $V_M$ of the photomask 10 at the constant speed is set to be faster than the moving speed $V_G$ of the object to be exposed 7, so that a difference between the moving distances of the photomask 10 and the object to be exposed 7 while the photomask 10 is moving varies as shown in FIG. 14. Therefore, it is possible to prevent the occurrence of the same exposure state as that of the still exposure during the constant speed phase of the moving of the photomask 10 as described in the above embodiment. Thereby, the over exposure in the constant speed phase can be avoided and a uniform exposure can be performed by a substantially uniform amount of exposure over the entire exposure area.

Although, in the above embodiment, a case is described in which the end region 15 of the mask pattern group is divided into 10 portions, the present invention is not limited to this, and the mask pattern group can be divided into any number of portions. In particular, the larger the number of divided portions, the more uniformly the exposure can be performed.

Figure 15:
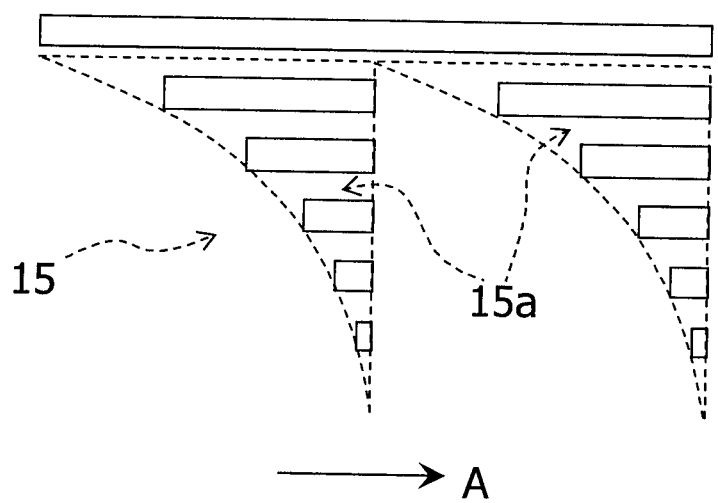
FIG. 15 is a plan view showing another shape example of small units formed by dividing an end region of the photomask into a plurality of small units.

In this case, the shape of each small unit 15a obtained by dividing the end region 15 into a plurality of portions is not limited to an isosceles triangle shown in FIG. 8, but the shape may be a right triangle in which the downstream side in a substrate conveying direction (direction indicated by the arrow A) is perpendicular to the direction indicated by the arrow A as shown in FIG. 15 or, as shown in FIG. 15, the side opposing the downstream side in the substrate conveying direction in the direction indicated by the arrow A may be a hyperbolic curve.

Figure 16A:
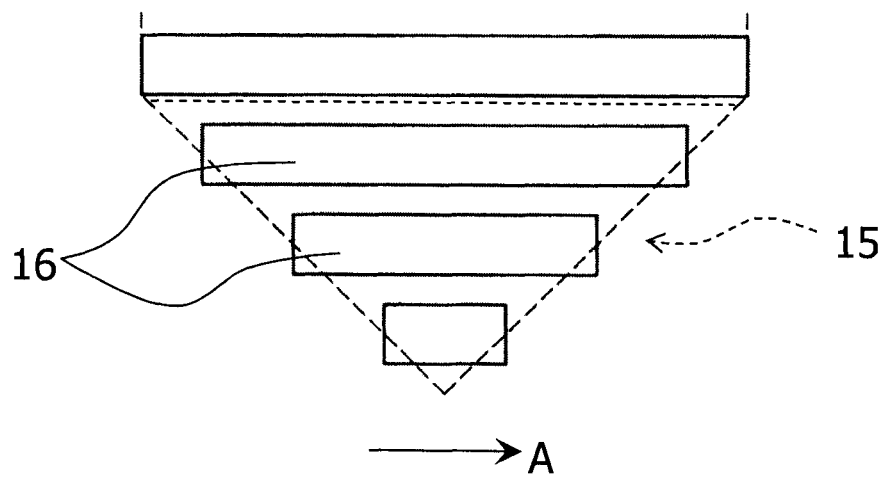
FIGS. 16A and 16B are plan views showing another shape example of a mask pattern located at an end region of a mask pattern group of the photomask.
Figure 16B:
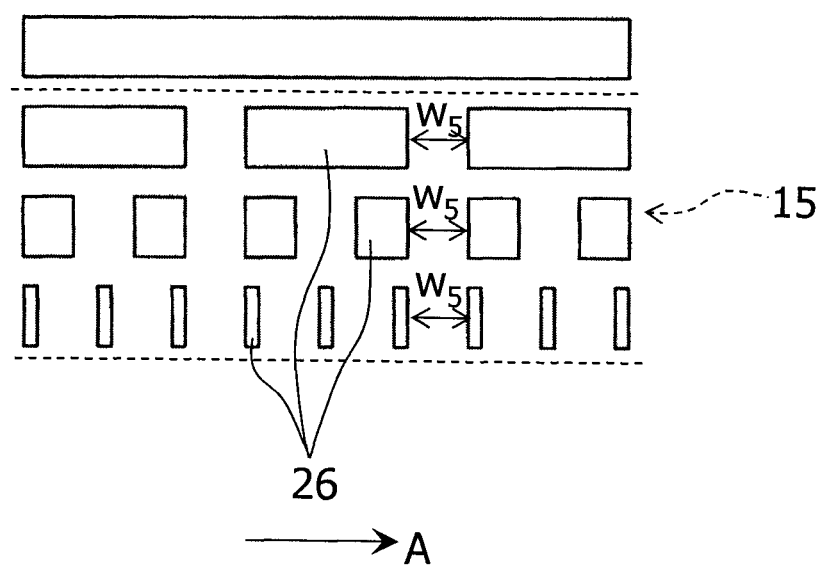

Furthermore, although, in the above embodiment, a case is described in which the end region 15 of the mask pattern group is a triangle, the present invention is not limited to this, and for example, as shown in FIGS. 16A and 16B, the mask patterns 16 may be divided into a plurality of small patterns 26 (see FIG. 16B) with a distance $W_5$ in between in a direction substantially perpendicular to the conveying direction of the object to be exposed 7 so that the total area of the divided mask patterns 16 is the same as the opening areas of the mask patterns 16 (see FIG. 16A) in the end region 15. In this case, if the distance $W_5$ is reduced to a length smaller than the resolution power (for example, about 1 μm), the exposure can be performed more uniformly.

Although, in the above embodiment, a case is described in which there are two exposure areas arranged on the object to be exposed 7, the present invention is not limited to this, and there may be three or more exposure areas arranged on the object to be exposed 7. In this case, three or more mask pattern groups are provided on the photomask 10. When step S9 described above is completed, the process returns to step S7, and steps S7 to S9 are repeatedly performed until the exposure to all the exposure areas is completed.

Although, in the present embodiment, a case is described in which the present invention is applied to a proximity exposure apparatus in which the photomask 10 is arranged to be opposite to and close to the object to be exposed 7, the present invention is not limited to this, but may be applied to a projection exposure apparatus in which the mask pattern group of the photomask 10 is projected and exposed onto the object to be exposed 7. In this case, the moving direction of the photomask 10 is opposite to the conveying direction of the object to be exposed 7.

It should be noted that the entire contents of Japanese Patent Application No. 2009-283067, filed on Dec. 14, 2009, on which the convention priority is claimed is incorporated herein by reference.

It should also be understood that many modifications and variations of the described embodiments of the invention will occur to a person having an ordinary skill in the art without departing from the spirit and scope of the present invention as claimed in the appended claims.

What is claimed is:

1. An exposure method for forming a different exposure pattern on each of a plurality of exposure areas arranged at predetermined intervals in a conveying direction of an object to be exposed while conveying the object at a constant conveying speed in one direction, the exposure method comprising:
   a step of moving a photomask by a predetermined distance in the same direction as the conveying direction of the object and switching one mask pattern group to another mask pattern group when an exposure to one exposure area on the object by the one mask pattern group of the photomask is completed, the photomask being formed by arranging a plurality of types of mask pattern groups corresponding to the exposure patterns at predetermined intervals in the conveying direction of the object; and
   a step of performing an exposure on a next exposure area on the object by the other mask pattern group,
   wherein a moving speed of the photomask is controlled so that a moving distance of the object is longer than a moving distance of the photomask in a period of time from when the photomask begins to move to switch the one mask pattern group to the other mask pattern group to when the photomask stops.

2. The exposure method according to claim 1, wherein the moving speed of the photomask is controlled to be switched to an acceleration phase in which the photomask is accelerated from a stopped state to a predetermined speed, a constant speed phase in which the photomask moves at the predetermined speed, and a deceleration phase in which the photomask decelerates and stops.

3. The exposure method according to claim 2, wherein the moving speed of the photomask in the constant speed phase is faster than the constant conveying speed of the object.

4. An exposure apparatus for forming a different exposure pattern on each of a plurality of exposure areas arranged on an object to be exposed at predetermined intervals in a conveying direction of the object while conveying the object at a constant conveying speed in one direction, the exposure apparatus comprising:
   a conveying device that conveys the object at the constant conveying speed;
   a mask stage which is provided to face an upper surface of the conveying device and which holds a photomask formed by arranging a plurality of types of mask pattern groups corresponding to the exposure patterns at predetermined intervals in the conveying direction and moves the photomask by a predetermined distance in the same direction as the conveying direction of the object to switch one mask pattern group to another mask pattern group when an exposure to one exposure area on the object to by the one mask pattern group is completed; and
   a control device that controls movement of the mask stage, wherein the control device controls a moving speed of the mask stage so that a moving distance of the object is longer than a moving distance of the photomask in a period of time from when the photomask begins to move to switch the one mask pattern group to the other mask pattern group to when the photomask stops.

5. The exposure apparatus according to claim 4, wherein the control device performs control to switch the moving speed of the mask stage to an acceleration phase in which the photomask is accelerated from a stopped state to a predetermined speed, a constant speed phase in which the photomask moves at the predetermined speed, and a deceleration phase in which the photomask decelerates and stops.

6. The exposure apparatus according to claim 5, wherein the control device performs control so that the moving speed of the mask stage in the constant speed phase is faster than the constant conveying speed of the object.

7. The exposure apparatus according to claim 4, wherein the photomask includes a first and a second photomask, each of which includes a plurality of sets of the plurality of types of mask pattern groups which are aligned in a line at predetermined intervals, and the first and the second photomasks are shifted from each other by a predetermined distance in a direction substantially perpendicular to the conveying direction of the object so that the plurality of sets of mask pattern groups are arranged in a direction substantially perpendicular to the conveying direction of the object at a predetermined pitch in a staggered pattern.

8. The exposure apparatus according to claim 7, wherein, in the same type of mask pattern groups of the plurality of types of mask pattern groups of the first and the second photomasks, mask patterns located in end regions of two mask pattern groups adjacent to each other as seen from the conveying direction of the object overlap each other, and the mask patterns located in the end regions have shapes different from a shape of mask patterns located in a central portion of the mask pattern groups so that a predetermined amount of exposure is obtained by a repeated exposure of the mask patterns corresponding to each other in the two mask pattern groups adjacent to each other.

9. The exposure apparatus according to claim 8, wherein mask patterns located in an end region of the mask pattern groups of the first and the second photomasks are divided into a plurality of portions at predetermined pitches in a direction substantially perpendicular to the conveying direction of the object to be exposed.

10. The exposure apparatus according to claim 8, wherein mask patterns located in an end region of the mask pattern groups of the first and the second photomasks are divided into a plurality of small patterns at predetermined intervals in a direction substantially perpendicular to the conveying direction of the object to be exposed and sizes of the small patterns are set so that a sum of areas of the plurality of small patterns is a predetermined value.

\* \* \* \* \*

UNITED STATES PATENT AND TRADEMARK OFFICE
CERTIFICATE OF CORRECTION

| | | |
|---|---|---|
| PATENT NO. | : 9,207,546 B2 | Page 1 of 1 |
| APPLICATION NO. | : 13/495668 | |
| DATED | : December 8, 2015 | |
| INVENTOR(S) | : Kajiyama et al. | |

It is certified that error appears in the above-identified patent and that said Letters Patent is hereby corrected as shown below:

On the Title Page, Item (56), line 3, "mailed Jul. 19, 2012" should read --mailed Jun. 28, 2012--.

In the claims

Claim 4, column 14, line 27, "object to by the one mask pattern" should read --object by the one mask pattern--.

Signed and Sealed this
Tenth Day of May, 2016

Michelle K. Lee
*Director of the United States Patent and Trademark Office*